US009264011B2

(12) United States Patent
Ishizuka et al.

(10) Patent No.: US 9,264,011 B2
(45) Date of Patent: Feb. 16, 2016

(54) IMPEDANCE-MATCHING SWITCHING CIRCUIT, ANTENNA DEVICE, HIGH-FREQUENCY POWER AMPLIFYING DEVICE, AND COMMUNICATION TERMINAL APPARATUS

(71) Applicant: Murata Manufacturing Co., Ltd., Nagaokakyo-shi, Kyoto-fu (JP)

(72) Inventors: Kenichi Ishizuka, Nagaokakyo (JP); Noriyuki Ueki, Nagaokakyo (JP); Noboru Kato, Nagaokakyo (JP); Koji Shiroki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 168 days.

(21) Appl. No.: 14/072,816

(22) Filed: Nov. 6, 2013

(65) Prior Publication Data
US 2014/0062817 A1    Mar. 6, 2014

Related U.S. Application Data

(63) Continuation of application No. PCT/JP2012/061593, filed on May 2, 2012.

(30) Foreign Application Priority Data

May 9, 2011 (JP) ................................. 2011-103968

(51) Int. Cl.
*H01Q 9/00* (2006.01)
*H03H 7/38* (2006.01)
(Continued)

(52) U.S. Cl.
CPC . *H03H 7/38* (2013.01); *H03H 7/40* (2013.01); *H04B 1/0458* (2013.01);
(Continued)

(58) Field of Classification Search
CPC ........................................................ H01Q 9/00
USPC .......................... 343/745, 702, 750, 752, 860
See application file for complete search history.

(56) References Cited

U.S. PATENT DOCUMENTS 5,212,491 A * 5/1993 Chin et al. ..................... 343/745
5,867,127 A * 2/1999 Black et al. .................... 343/702
(Continued)

FOREIGN PATENT DOCUMENTS

CN              1822435 A       8/2006
CN            102341957 A       2/2012
(Continued)

OTHER PUBLICATIONS

Official Communication issued in corresponding Japanese Patent Application No. 2013-514000, mailed on Jun. 24, 2014.
(Continued)

*Primary Examiner* — Huedung Mancuso
(74) *Attorney, Agent, or Firm* — Keating & Bennett, LLP

(57) ABSTRACT

An antenna device includes an impedance-matching switching circuit connected to a feeding circuit, and a radiating element. The impedance-matching switching circuit matches the impedance of the radiating element as a second high frequency circuit element and the impedance of the feeding circuit as a first high frequency circuit element. The impedance-matching switching circuit includes a transformer matching circuit and a series active circuit. The transformer matching circuit matches the real parts of the impedance and matches the imaginary parts of the impedance in the series active circuit. Thus, impedance matching is performed over a wide frequency band at a point at which high frequency circuits or elements having different impedances are connected to each other.

18 Claims, 18 Drawing Sheets

(51) Int. Cl.
*H04B 1/04* (2006.01)
*H04B 1/3827* (2015.01)
*H03H 7/40* (2006.01)
*H03H 7/09* (2006.01)
*H03H 1/00* (2006.01)
*H01F 19/04* (2006.01)
*H01F 27/28* (2006.01)

(52) U.S. Cl.
CPC ............ *H04B 1/3827* (2013.01); *H01F 19/04* (2013.01); *H01F 2027/2809* (2013.01); *H03H 7/09* (2013.01); *H03H 2001/0085* (2013.01)

(56) References Cited

U.S. PATENT DOCUMENTS

| | | | |
|---|---|---|---|
| 7,502,638 B2* | 3/2009 | Shimizu et al. | 455/575.7 |
| 8,325,097 B2* | 12/2012 | McKinzie et al. | 343/703 |
| 2004/0189542 A1 | 9/2004 | Mori | |
| 2005/0007291 A1* | 1/2005 | Fabrega-Sanchez et al. | 343/860 |
| 2006/0183433 A1 | 8/2006 | Mori et al. | |
| 2011/0309994 A1 | 12/2011 | Kato et al. | |

FOREIGN PATENT DOCUMENTS

| | | |
|---|---|---|
| JP | 02-261209 A | 10/1990 |
| JP | 03-080509 A | 4/1991 |
| JP | 06-053770 A | 2/1994 |
| JP | 2003-100518 A | 4/2003 |
| JP | 2004-228796 A | 8/2004 |
| JP | 2008-035065 A | 2/2008 |
| JP | 2008-061116 A | 3/2008 |
| JP | 2008-177486 A | 7/2008 |
| JP | 2012-084833 A | 4/2012 |
| JP | 2012-085250 A | 4/2012 |
| JP | 2012-085305 A | 4/2012 |

OTHER PUBLICATIONS

Official Communication issued in International Patent Application No. PCT/JP2012/061593, mailed on Jul. 17, 2012.

* cited by examiner

IMPEDANCE-MATCHING SWITCHING CIRCUIT, ANTENNA DEVICE, HIGH-FREQUENCY POWER AMPLIFYING DEVICE, AND COMMUNICATION TERMINAL APPARATUS

BACKGROUND OF THE INVENTION

1. Field of the Invention

The present invention relates to an impedance-matching switching circuit that performs impedance matching at a point at which high frequency circuits or elements having different impedances are connected to each other, and an antenna device, a high-frequency power amplifying device, and a communication terminal apparatus that are equipped with the impedance-matching switching circuit.

2. Description of the Related Art

In recent years, communication terminal apparatuses, such as mobile phones, may require compatibility with not only communication systems, such as a GSM (registered trademark) (Global System for Mobile communication), DCS (Digital Communication System), PCS (Personal Communication Services), and UMTS (Universal Mobile Telecommunications System), but also communication systems, such as a GPS (Global Positioning System), a wireless LAN, Bluetooth (registered trademark), and the like. Thus, antenna devices used for such communication terminal apparatuses are required to cover a wide frequency band of 700 MHz to 2.7 GHz.

Generally, antenna devices have a configuration in which the characteristic of an impedance matching circuit is changed by using an active element in order to cover a wide frequency band. As disclosed in Japanese Unexamined Patent Application Publication No. 2008-035065, for example, antenna devices that connect a frequency switching circuit (a frequency switching type matching circuit) including a variable capacitance element at a feeding end of an antenna element are known.

However, small antenna elements used especially for communication terminal apparatuses have extremely large frequency characteristic of impedance, which causes a problem.

FIG. 1A illustrates an example of an antenna device equipped with an impedance matching circuit using an active element. In addition, FIG. 2A illustrates an example of impedance of a small monopole antenna that resonates around 1300 MHz.

The real part R of the impedance of this antenna is:
around 900 MHz: R=6 Ω
around 1300 MHz: R=18 Ω
around 1900 MHz: R=25 Ω.

Monopole antennas ideally have impedance of 23Ω. However, as compared with a wavelength of a high frequency radio signal, as an electrical length of a radiating element is shorter, that is, as antennas are made smaller, impedance is reduced correspondingly. Therefore, in accordance with the wavelength of a high frequency radio signal transmitted and received by this radiating element, the real part of the impedance of antennas is very largely changed.

FIG. 2B illustrates a characteristic of return loss (S11) of this small antenna. In FIG. 2B, AO represents a characteristic in a state in which the series active circuit of FIG. 1A is not inserted, AL represents a characteristic in a state in which the series active circuit has chosen an inductance element of 13 nH, and AC represents a characteristic in a state in which the series active circuit has chosen a capacitance element of 0.65 pF.

In this way, when a series inductor is inserted in a portion of the series active circuit, the resonant frequency is shifted to a lower frequency, and the resonant frequency is shifted to a higher frequency when a series capacitor is inserted.

However, as illustrated in FIG. 2B, even if a reactance element is simply loaded in series so that an imaginary part jx of the inductance becomes zero, a degree of impedance matching (depth of return loss) changes depending on a frequency because the value of a real part R of the impedance of an antenna largely changes depending on the frequency.

Accordingly, since proper impedance matching cannot be performed only in a series active circuit, as disclosed in Japanese Unexamined Patent Application Publication No. H06-053770, for example, it is necessary to perform matching by connecting an inductor and a capacitor in parallel. However, since the value of the reactance that is loaded in parallel has a different optimum value with respect to each frequency, a circuit to be connected in parallel needs to be an active circuit as illustrated in FIG. 1B.

Therefore, at least the following problems occur:
(1) increase in cost due to complications of a matching circuit including an active element;
(2) increase in overall size due to a too large number of elements defining a matching circuit including an active element; and
(3) distortion easily generated due to high load power applied to an active element by loading the active element in parallel.

The above-stated problems generally occur in not only a circuit that performs matching between a feeding circuit and an antenna, but also a circuit that performs impedance matching between two high frequency circuits mutually having different impedances.

SUMMARY OF THE INVENTION

In view of the circumstances described above, preferred embodiments of the present invention provide an impedance-matching switching circuit that performs impedance matching over a wide frequency band at a point at which high frequency circuits or elements having different impedances are connected to each other, and an antenna device, a high-frequency power amplifying device, and a communication terminal apparatus that are equipped with the impedance-matching switching circuit.

An impedance-matching switching circuit according to a preferred embodiment of the present invention is an impedance-matching switching circuit connected between a first high frequency circuit element and a second high frequency circuit element, the impedance-matching switching circuit including a transformer matching circuit including a first circuit including a first inductance element; and a second circuit including a second inductance element transformer-coupled to the first inductance element, and a series active circuit connected to the transformer matching circuit in series and configured to select a desired reactance value among a plurality of reactance values, wherein a frequency characteristic of an impedance conversion ratio of the transformer matching circuit by transformer coupling between the first inductance element and the second inductance element is a characteristic having a tendency opposite to an impedance frequency characteristic of the second high frequency circuit element. In this preferred embodiment, "a first high frequency circuit element" preferably is a circuit element which defines a high frequency circuit or a portion of a high frequency circuit. Similarly, "a second high frequency circuit element" preferably is a circuit element which defines a high frequency circuit or a portion of a high frequency circuit.

An antenna device according to a preferred embodiment of the present invention includes a radiating element; and an impedance-matching switching circuit connected to the radiating element and is connected to a feeding circuit, the impedance-matching switching circuit including a transformer matching circuit including a first circuit including a first inductance element; and a second circuit including a second inductance element transformer-coupled to the first inductance element; and a series active circuit connected in series between the transformer matching circuit and the radiating element and configured to include: a plurality of reactance elements; and a switch that switches selection of the reactance elements, wherein a frequency characteristic of an impedance conversion ratio of the transformer matching circuit by transformer coupling between the first inductance element and the second inductance element is a characteristic having a tendency opposite to an impedance frequency characteristic of the radiating element.

A high-frequency power amplifying device according to a preferred embodiment of the present invention includes a high-frequency power amplifier with an output portion; and an impedance-matching switching circuit connected to the output portion of the high-frequency power amplifier, the impedance-matching switching circuit including a transformer matching circuit includes a first circuit including a first inductance element; and a second circuit including a second inductance element transformer-coupled to the first inductance element; and a series active circuit connected in series between the transformer matching circuit and the high-frequency power amplifier and configured to include a plurality of reactance elements; and a switch that switches selection of the reactance elements, wherein a frequency characteristic of an impedance conversion ratio of the transformer matching circuit by transformer coupling between the first inductance element and the second inductance element is a characteristic having a tendency opposite to an impedance frequency characteristic of the high-frequency power amplifier.

A communication terminal apparatus according to a preferred embodiment of the present invention includes a radiating element; a feeding circuit; an impedance-matching switching circuit; and a casing in which the radiating element, the feeding circuit, and the impedance-matching switching circuit that is inserted between the radiating element and the feeding circuit are arranged, the impedance-matching switching circuit including a transformer matching circuit including a first circuit including a first inductance element; and a second circuit including a second inductance element transformer-coupled to the first inductance element; and a series active circuit connected in series between the transformer matching circuit and the radiating element, and configured to include a plurality of reactance elements; and a switch that switches selection of the reactance elements, wherein a frequency characteristic of an impedance conversion ratio of the transformer matching circuit by transformer coupling between the first inductance element and the second inductance element is a characteristic having a tendency opposite to an impedance frequency characteristic of the radiating element.

According to various preferred embodiments of the present invention, without complicating a circuit configuration, inparticular, without providing a parallel active circuit, impedance matching is performed over a wide band at a point at which high frequency circuits or elements having different impedances are connected to each other.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 3:
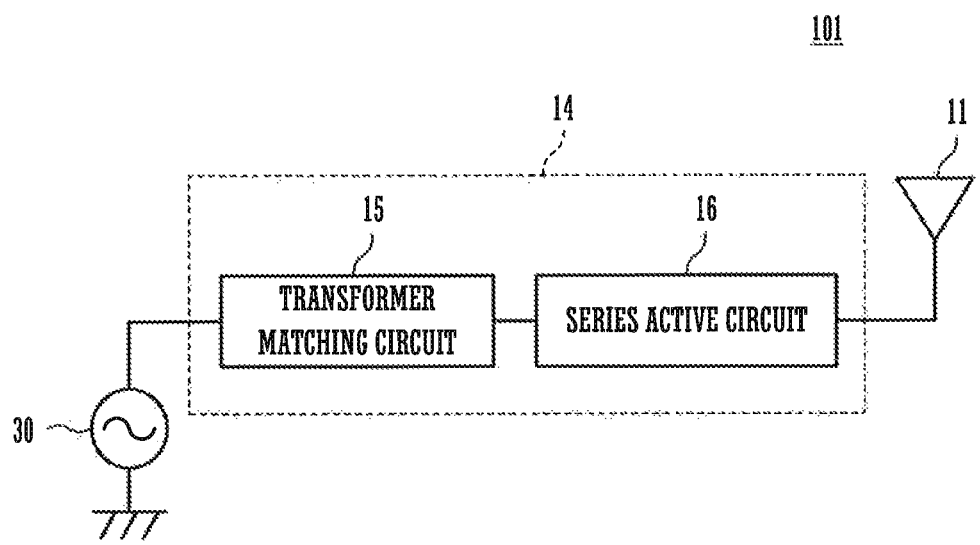
FIG. 3 is a circuit diagram of an antenna device 101 according to a first preferred embodiment of the present invention.

FIG. 3 is a circuit diagram of an antenna device 101 according to a first preferred embodiment of the present invention. The antenna device 101 preferably includes an impedance-matching switching circuit 14 connected to a feeding circuit 30, and a radiating element 11. The impedance-matching switching circuit 14 matches the impedance of the radiating element 11 as a second high frequency circuit element and the impedance of the feeding circuit 30 as a first high frequency circuit element. The impedance-matching switching circuit 14 preferably includes a transformer matching circuit 15 and a series active circuit 16. The series active circuit 16 is typically a variable capacity circuit.

The radiating element 11 is preferably a monopole antenna, for example, and the radiating element 11 includes a feeding end that is connected to the impedance transformation circuit 14. The feeding circuit 30 is a circuit that feeds a high-frequency signal to the radiating element 11, generates or processes the high-frequency signal, and may include a circuit that multiplexes and demultiplexes the high-frequency signal.

Figure 4A:
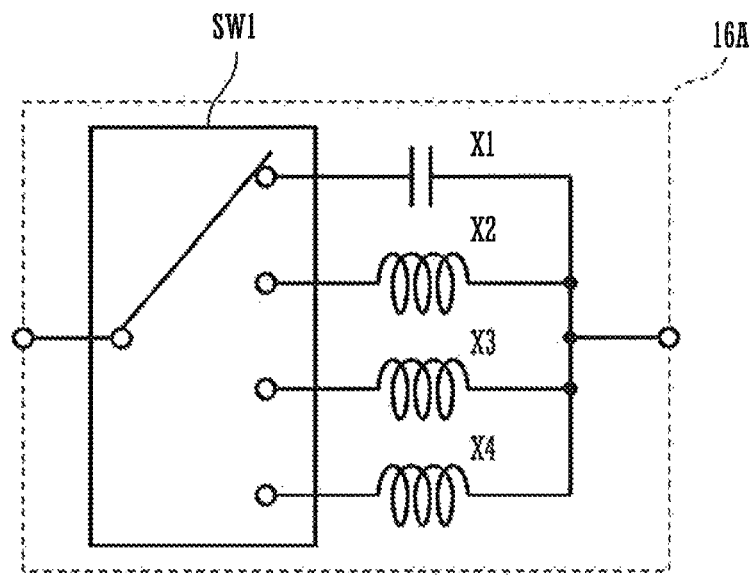
FIG. 4A, FIG. 4B, and FIG. 4C illustrate three examples of the series active circuit 16 illustrated in FIG. 3.
Figure 4B:
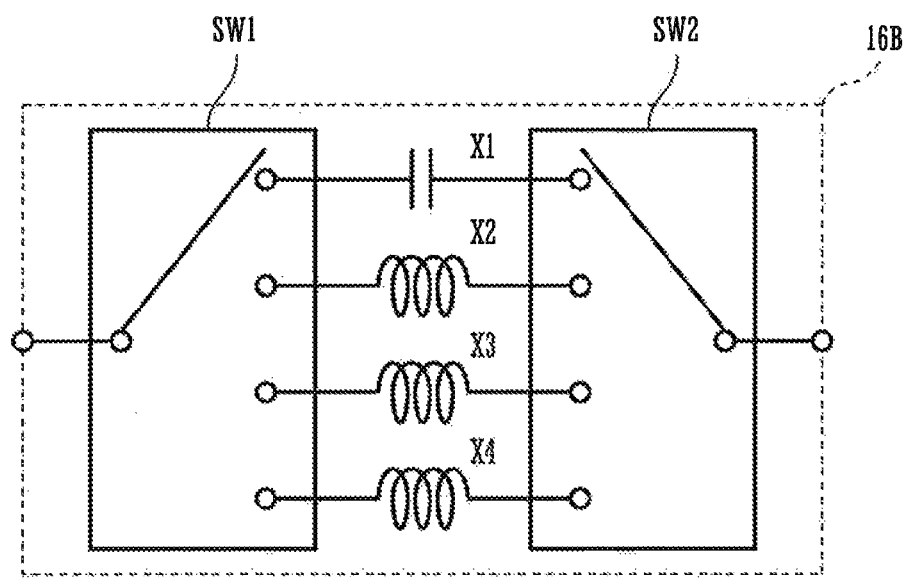
Figure 4C:
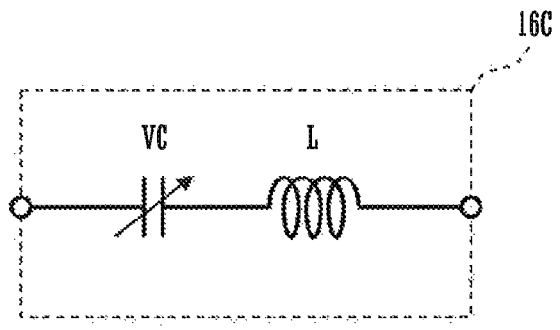

FIG. 4A, FIG. 4B, and FIG. 4C illustrate three examples of the series active circuit 16 illustrated in FIG. 3. A series active circuit 16A of FIG. 4A includes a plurality of reactance elements X1, X2, X3, and X4, and a switch SW1. By switching the switch SW1, any one of the reactance elements X1 to X4 is connected in series to a line. With this configuration of FIG. 4A, since stray capacitance generated in a switch portion is connected to a reactance element in series, the value of the reactance element is set in consideration of this stray capacitance.

A series active circuit 16B of FIG. 4B preferably includes a plurality of reactance elements X1, X2, X3, and X4, and two switches SW1 and SW2. The switches SW1 and SW2 are switched to select the same reactance element among the reactance elements X1, X2, X3, and X4. Thus, the structure in which the front and rear of the reactance element is selected with a switch enables the circuit to be hardly affected by the stray capacitance generated in the switch portion.

A series active circuit 16C of FIG. 4C preferably includes a series circuit including a variable capacitance element VC and an inductor L. This variable capacitance element VC includes a capacitance value that changes depending on control voltage to be applied, and can obtain a predetermined reactance value in an applicable frequency by an LC series circuit. As a variable capacitance element, a MEMS (Micro Electro Mechanical System) element and a variable capacitance diode can be used, and the MEMS element may more advantageously be used in that distortion due to nonlinearity of voltage-capacity is not generated.

Figure 5:
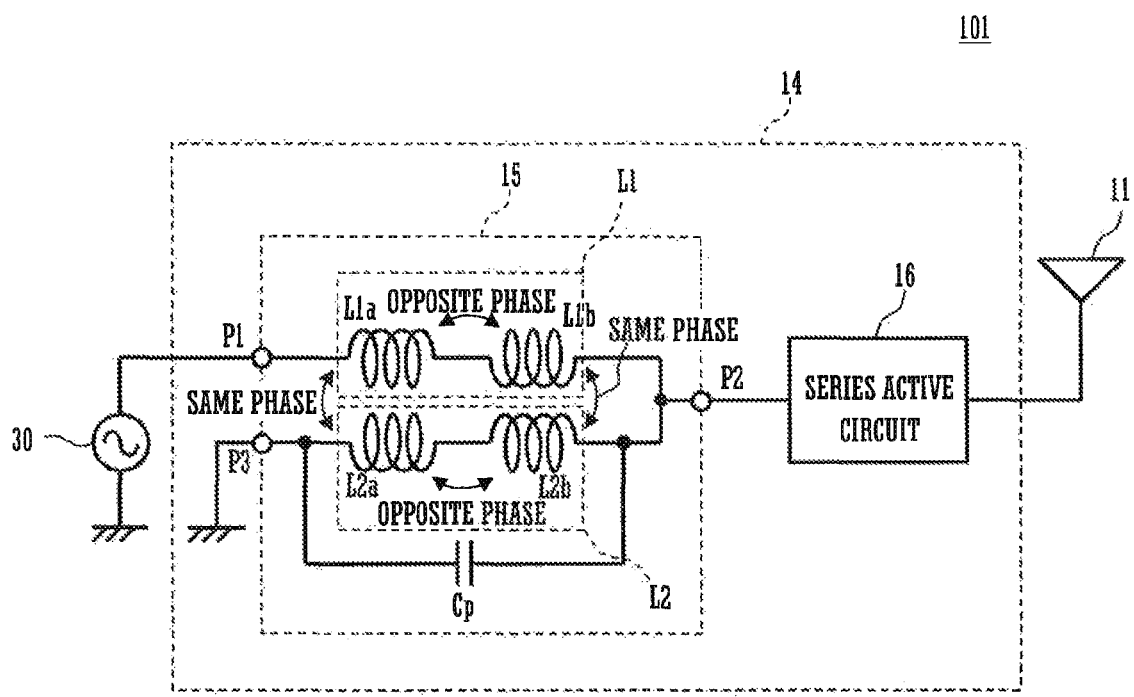
FIG. 5 is a view illustrating an internal circuit configuration of a transformer matching circuit 15 included in the antenna device 101 illustrated in FIG. 3.

FIG. 5 is a view illustrating an internal circuit configuration of a transformer matching circuit 15 included in the antenna device 101 illustrated in FIG. 3. The transformer matching circuit 15 includes a first circuit including a first inductance element L1, and a second circuit including a second inductance element L2 that is transformer-coupled to the first inductance element L1. Specifically, the first circuit includes a first coil element L1a and a second coil element L1b that are connected in series, and the second circuit includes a third coil element L2a and a fourth coil element L2b that are connected in series. Then, the third coil element L2a is electromagnetically coupled to the first coil element L1a, and the fourth coil element L2b is electromagnetically coupled to the second coil element L1b.

The coil elements L1a, L1b, L2a, and L2b are arranged so that each mutual inductance may have the relationship of FIG. 5. In other words, the third coil element L2a is coupled to the first coil element L1a in the same phase (subtractive polarity coupling) and the fourth coil element L2b is coupled to the second coil element L1b in the same phase (subtractive polarity coupling). Similarly, the second coil element L1b is coupled to the first coil element L1a in an opposite phase (additive polarity coupling) and the fourth coil element L2b is coupled to the third coil element L2a in an opposite phase (additive polarity coupling).

As described in full detail later, the second inductance element L2 is transformer-coupled to the first inductance element L1 with a high degree of coupling, and impedance-converted at a ratio equivalent to the ratio between primary side and secondary side inductances. The inductance of the first inductance element L1 is represented by L1, and the inductance of the second inductance element L2 is represented by L2. In this case, the impedance conversion ratio of this transformer matching circuit 15 is $L2/(L1+L2+2M)$ (however, $M=k\sqrt{(L1*L2)}$, k represents a coupling coefficient).

As illustrated in FIG. 5, parallel capacitance Cp arranged in parallel with the second inductance element L2 is provided. This enables the real part of impedance as viewed from the point P2 of FIG. 5 to the feeding circuit 30 side to have a frequency characteristic similar to the radiation resistance of the antenna. In other words, while an impedance ratio between the first inductance element L1 and the second inductance element L2 is constant irrespective of frequency in the absence of the parallel capacitance Cp, the inductance of a parallel circuit including the parallel capacitance Cp and the second inductance element L2, in the presence of the parallel capacitance Cp, increases gradually at or below a resonant frequency as the frequency increases. Therefore, the value of a real part of impedance as viewed from the point P2 to the feeding circuit 30 increases as the frequency increases at or below the resonant frequency. Accordingly, appropriately set element values of L1, L2, Cp can make the frequency characteristic of the real part of impedance as viewed from the point P2 to the high frequency circuit 30 side equal to the frequency characteristic of a radiation resistance of the antenna.

The parallel capacitance Cp may be provided by connecting a capacitor component as a component to the second inductance element L2 in parallel or may be provided by parasitic capacitance generated by making the wiring of the second inductance element L2 closer to a ground conductor.

Figure 6:
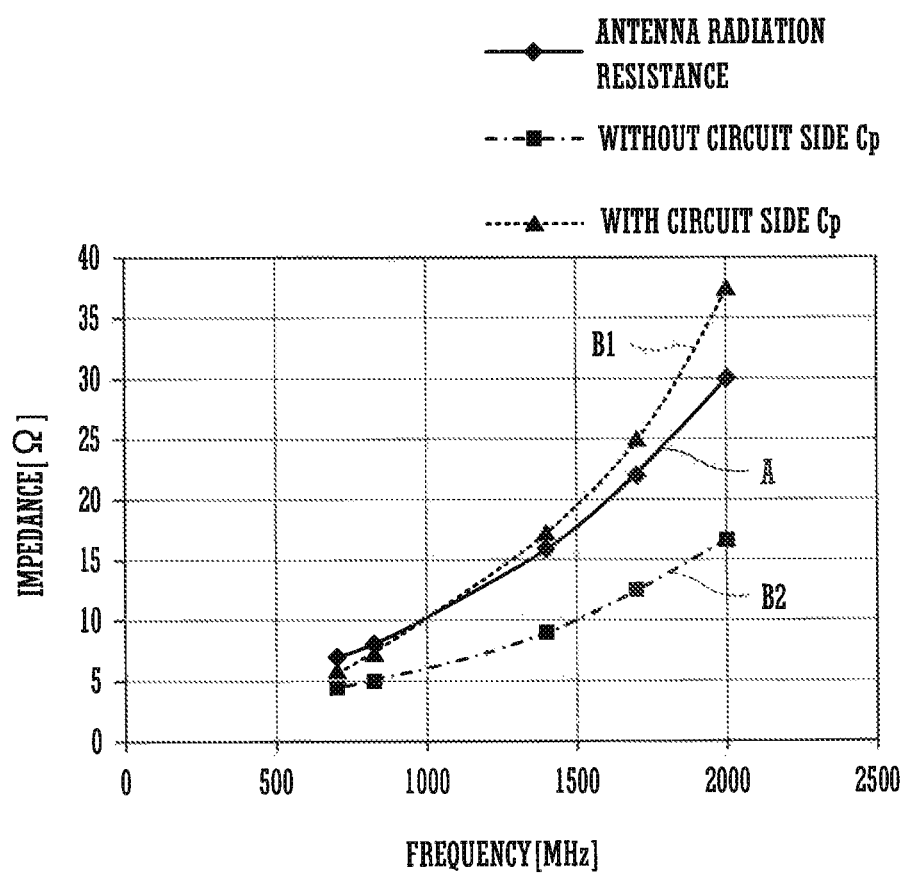
FIG. 6 is a view illustrating a frequency characteristic of a real part (a resistance component) of impedance of the transformer matching circuit 15 as viewed from a connection portion of the series active circuit 16 illustrated in FIG. 5.

FIG. 6 is a view illustrating a frequency characteristic of a real part (a resistance component) of impedance of the transformer matching circuit 15 as viewed from a connection portion of the series active circuit 16 illustrated in FIG. 5. In FIG. 6, A represents radiation resistance of the antenna, B1 represents a real part of the impedance of a transformer matching circuit 15 in the presence of the parallel capacitance Cp, B2 represents a real part of the impedance of the transformer matching circuit 15 in the absence of the parallel capacitance Cp. It is apparent that the presence of parallel capacitance Cp can make the frequency characteristic of a real part Rc of impedance closer to the frequency characteristic of a radiation resistance Rr of an antenna, and the transformer matching circuit 15 can match the antenna and a high frequency circuit in a further wider frequency band. As described above, a frequency characteristic of an impedance conversion ratio of the transformer matching circuit by transformer coupling between the first inductance element and the second inductance element is a characteristic having a tendency opposite to an impedance frequency characteristic of the antenna. In other words, "an opposite tendency" means "a tendency to reduce an impedance conversion ratio of the transformer matching circuit as the impedance of the antenna is higher".

Figure 1A:
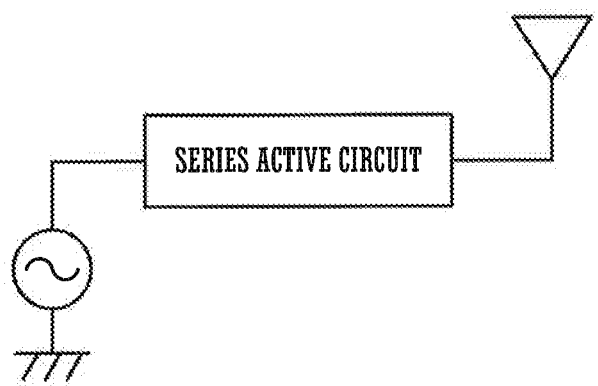
FIG. 1A is a circuit diagram of an antenna device equipped with an impedance matching circuit including an active element.
Figure 1B:
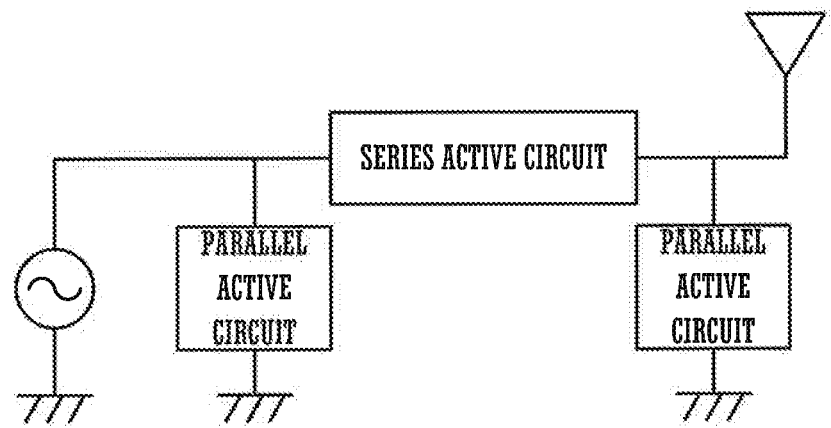
FIG. 1B is a circuit diagram of a conventional antenna device equipped with a series active circuit and a parallel active circuit.
Figure 2A:
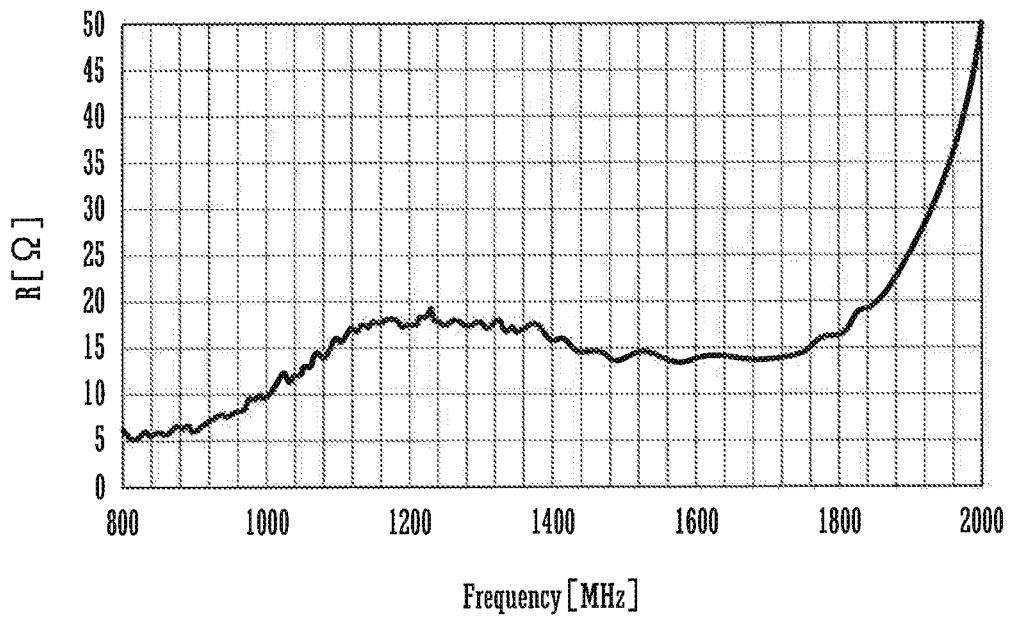
FIG. 2A is a view illustrating an example of a frequency characteristic of impedance of a small antenna that resonates around 1300 MHz.
Figure 2B:
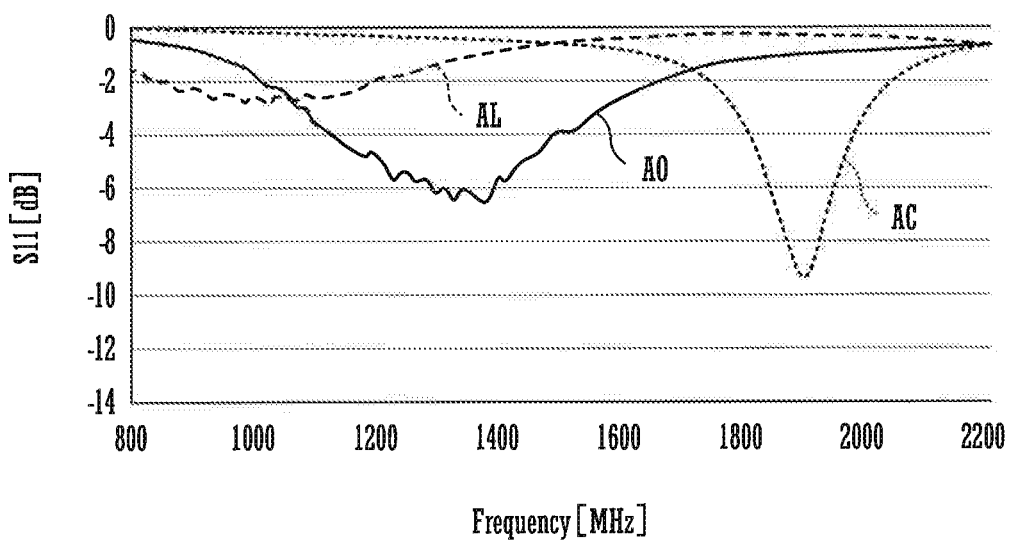
FIG. 2B is a view illustrating a characteristic of return loss (S11) of the antenna illustrated in FIG. 1A.

As illustrated in Figures such as FIG. 2, as an antenna is made smaller and an electrical length of a radiating element becomes shorter than the wavelength of a high frequency radio signal transmitted and received by a radiating element, the impedance of the antenna becomes lower. Thus, the impedance of the antenna included in a small communication terminal apparatus is mainly lower than about 50Ω and extremely reduced to about 5Ω in a low band, for example. This indicates impedance matching in a low band becomes more severe.

Figure 7:
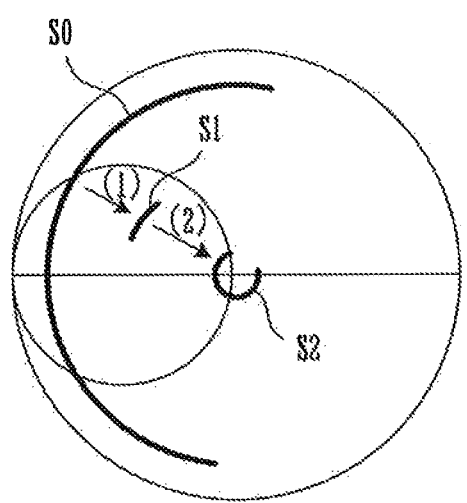
FIG. 7 is a view schematically illustrating an effect of a transformer matching circuit 15 and a series active circuit 16.

FIG. 7 is a view schematically illustrating an effect of a transformer matching circuit 15 and a series active circuit 16. A curve S0 in FIG. 7 represents, on a Smith chart, an impedance trace obtained by sweeping the frequency over a frequency band used by the radiating element 11. Since the inductance component in the radiating element 11 alone is relatively large, the impedance changes significantly according to change in frequency as illustrated in FIG. 7.

A curve S1 in FIG. 7 represents a trace of impedance as viewed from the point P2 illustrated in FIG. 5 to the radiating element 11 side. Like the change indicated by (1) in FIG. 7, the reactance component of the series active circuit 16 cancels the inductance component of the radiating element, so that the impedance trace as viewed from the point P2 to the radiating element 11 side is significantly reduced.

A curve S2 in FIG. 7 represents a trace of impedance viewed from the feeding circuit 30, i.e., impedance of the antenna device 101. Since the transformer of the transformer matching circuit 15 changes the real part of impedance without changing the imaginary part of impedance, depending on the impedance conversion ratio by the transformer matching circuit 15, the impedance of the antenna device 101 approaches 50Ω (the center of the Smith chart), for example.

In this way, the change in impedance of the antenna device can be significantly reduced or prevented over a wide band. Therefore, it is possible to provide impedance matching between the feeding circuit and the antenna device over a wide frequency band.

Figure 8A:
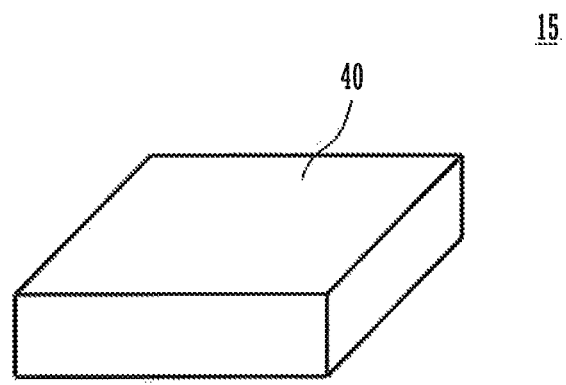
FIG. 8A is a perspective view of a transformer matching circuit 15.
Figure 8B:
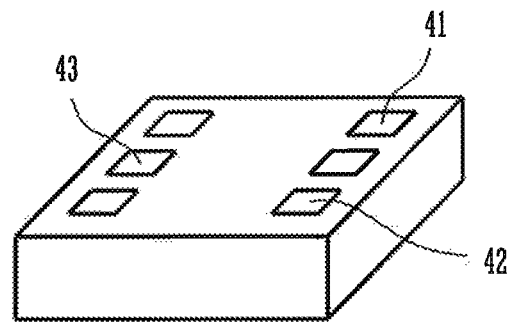
FIG. 8B is a perspective view when the transformer matching circuit 15 is viewed from the lower surface side.
Figure 9:
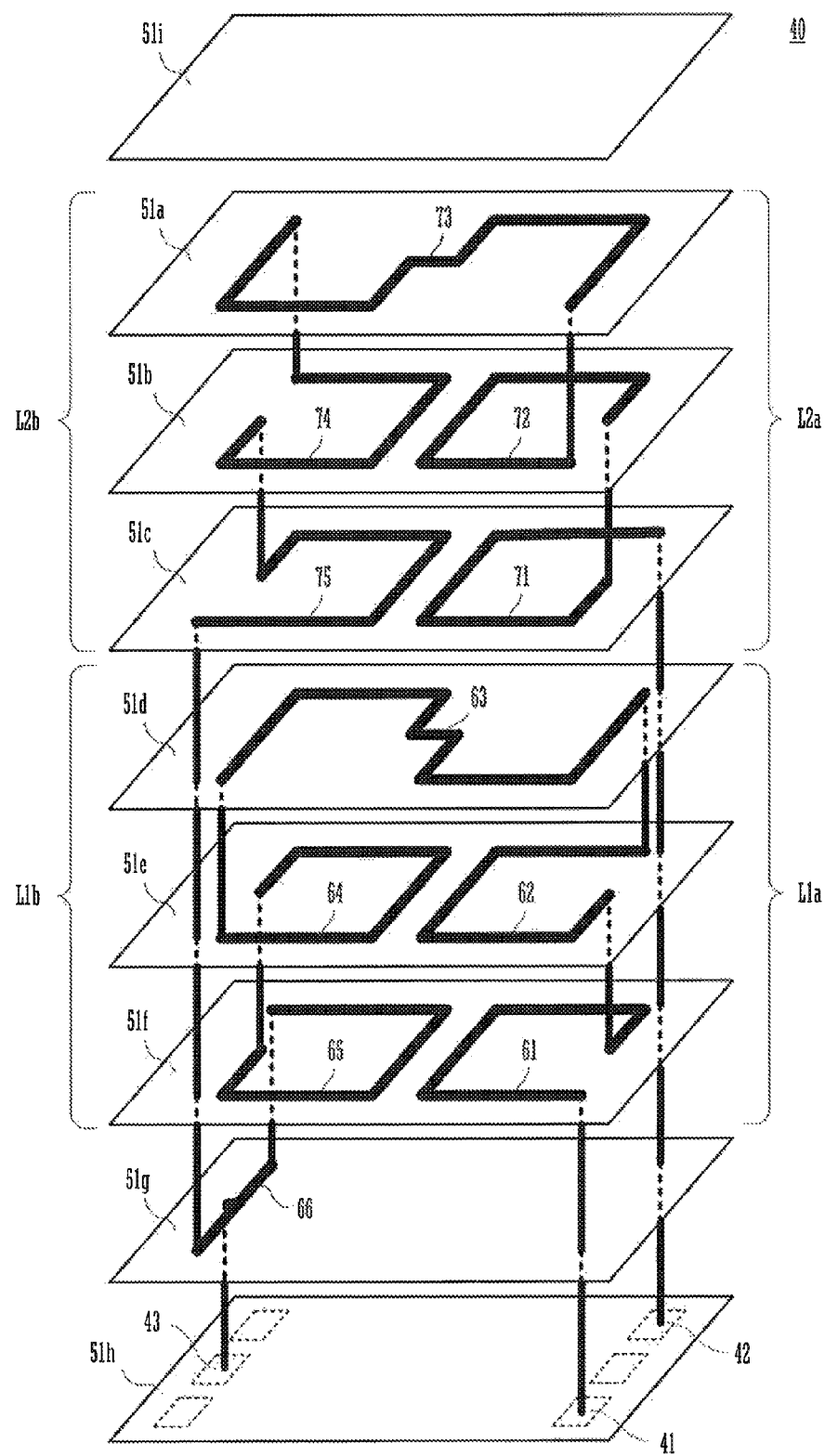
FIG. 9 is an exploded perspective view of a laminate 40 that defines a transformer matching circuit 15.

FIG. 8A is a perspective view of the transformer matching circuit 15, and FIG. 8B is a perspective view when the transformer matching circuit 15 is viewed from the lower surface side. FIG. 9 is an exploded perspective view of a laminate 40 that defines the transformer matching circuit 15.

As illustrated in FIG. 9, the base material layers are preferably defined either by a dielectric sheet or a magnetic sheet, and a conductor pattern is provided on each layer. In the area illustrated in FIG. 9, a conductor pattern 73 is provided on the base material layer 51a, conductor patterns 72 and 74 are provided on the base material layer 51b, and conductor patterns 71 and 75 are provided on the base material layer 51c. A conductor pattern 63 is provided on the base material layer 51d, conductor patterns 62 and 64 are provided on the base material layer 51e, and conductor patterns 61 and 65 are provided on the base material layer 51f. Additionally, a conductor pattern 66 is provided on the base material layer 51g, and a feeding terminal 41, a ground terminal 42, and an antenna terminal 43 are provided on the base material layer 51h. Dashed lines extending vertically in FIG. 9 represent via electrodes that provide inter-layer connections between the corresponding conductor patterns.

In FIG. 9, the right half of the conductor pattern 63, and the conductor patterns 61 and 62 define the first coil element L1a. The left half of the conductor pattern 63, and the conductor patterns 64 and 65 define the second coil element L1b. The right half of the conductor pattern 73, and the conductor patterns 71 and 72 define the third coil element L2a. The left half of the conductor pattern 73, and the conductor patterns 74 and 75 define the fourth coil element L2b. The winding axes of the coil elements L1a, L1b, L2a, and L2b are oriented in the lamination direction of the multilayer substrate. The winding axes of the first coil element L1a and the second coil element L1b are juxtaposed to have a different relationship. Similarly, the third coil element L2a and the fourth coil element L2b are juxtaposed so that the respective winding axes have a different relationship. The winding area of the first coil element L1a and the winding area of the third coil element L2a overlap each other at least partially in a plan view and the winding area of the second coil element L1b and the winding area of the fourth coil element L2b overlap each other at least partially in a plan view. In this preferred embodiment, the coil elements substantially completely overlap each other. In the manner described above, the four coil elements preferably include the conductor patterns having an 8-shaped structure, for example.

Figure 10:
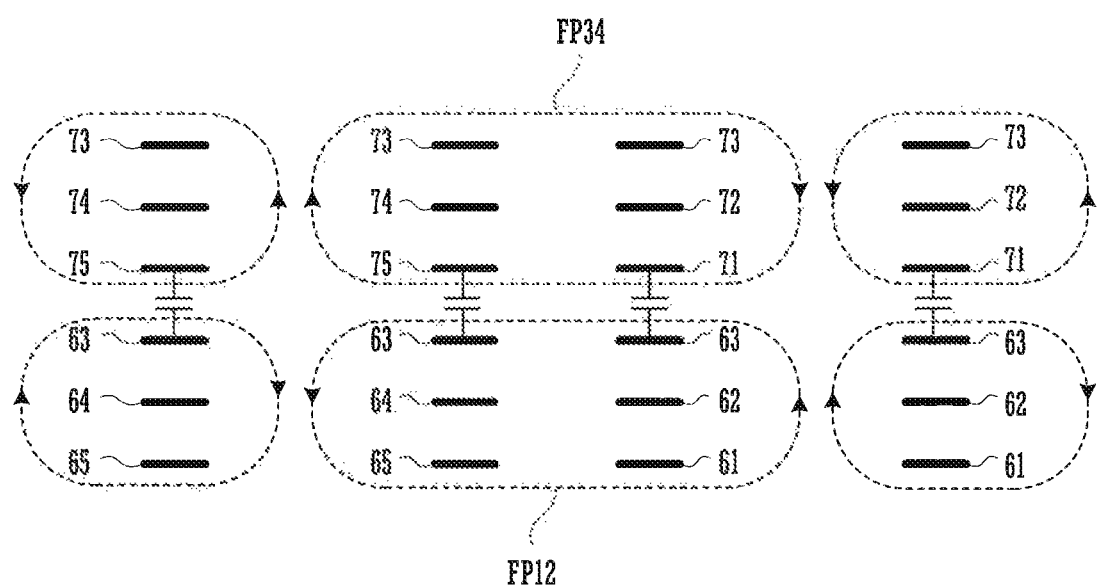
FIG. 10 illustrates major magnetic fluxes that pass through coil elements having conductor patterns provided on individual layers of the multilayer substrate illustrated in FIG. 9.

FIG. 10 illustrates major magnetic fluxes that pass through coil elements having conductor patterns provided on individual layers of the multilayer substrate illustrated in FIG. 9. A magnetic flux FP12 passes through the first coil element L1a including the conductor patterns 61 to 63, and the second coil element L1b including the conductor patterns 63 to 65. In a similar manner, a magnetic flux FP34 passes through the third coil element L2a including the conductor patterns 71 to 73, and the fourth coil element L2b including the conductor patterns 73 to 75.

Figure 11:
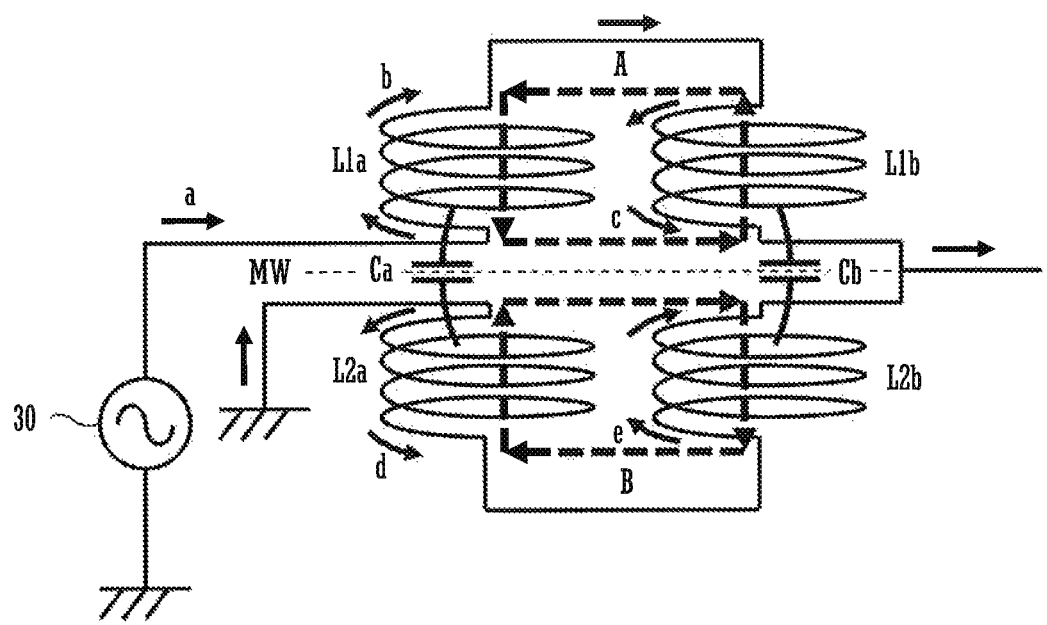
FIG. 11 is a view illustrating a way of coupling between respective coil elements in a transformer portion of the transformer matching circuit 15 of the first preferred embodiment of the present invention.

FIG. 11 is a view illustrating a way of coupling between respective coil elements in a transformer portion of the transformer matching circuit 15 of the first preferred embodiment. The first coil element L1a and the third coil element L2a are adjacently arranged in the direction of the coil axis so as to share (to be collinear with) the winding axes of the first coil element L1a and the third coil element L2a. Similarly, the second coil element L1b and the fourth coil element L2b are adjacently arranged in the direction of the coil axis so as to share (to be collinear with) the winding axes of the second coil element L1b and the fourth coil element L2b. According to this structure, the first coil element L1a and the second coil element L1b define a first closed magnetic circuit in which a magnetic flux passes through the inside of these coil elements, the third coil element L2a and the fourth coil element L2b define a second closed magnetic circuit in which a magnetic flux passes through the inside of these coil elements. Then, the magnetic fluxes that pass through these two closed magnetic circuits are repelled each other. The details are as follows.

As illustrated in FIG. 11, when a current flows in a first transmission line in a direction indicated by arrow a in the figure, a current flows in the first coil element L1a in a direction indicated by arrow b in the figure and also a current flows in the second coil element L1b in a direction indicated by arrow c in the figure. Then, these currents define a closed loop of a magnetic flux (a magnetic flux passing through a first closed magnetic circuit), as indicated by arrow A in the figure.

Since the first coil element L1a and the third coil element L2a share a coil winding axis, and the conductor patterns of these two coil elements are parallel or substantially parallel to each other in a plan view state (a state in which the elements are viewed in a direction of the coil winding axis), a magnetic field generated as a result of flowing of the current b in the first coil element L1a is coupled to the third coil element L2a and thus an induced current d flows in the third coil element L2a in an opposite direction. Similarly, since the second coil element L1b and the fourth coil element L2b are parallel or substantially parallel to each other, a magnetic field generated as a result of flowing of the current c in the second coil element L1b is coupled to the fourth coil element L2b and thus an induced current e flows in the fourth coil element L2b in an opposite direction. Then, these currents define a closed loop of a magnetic flux (a magnetic flux passing through a second closed magnetic circuit), as indicated by arrow B in the figure.

Since the magnetic flux passing through the closed magnetic circuit including the coil elements L1a and L1b and the magnetic flux passing through the closed magnetic circuit including the coil elements L2a and L2b repel each other, an equivalent magnetic barrier MW is generated between the first closed magnetic circuit and the second closed magnetic circuit.

As described above, since the magnetic flux passing through a closed magnetic circuit including the coil elements L1a and L1b and the magnetic flux passing through a closed magnetic circuit including the coil elements L2a and L2b repel each other, the magnetic flux density around the coil elements becomes high. Specifically, such an advantageous effect as if a magnetic flux is confined in a magnetic body is provided.

In addition, the coil element L1a and the coil element L2a are also coupled to each other through an electric field. Similarly, the coil element L1b and the coil element L2b are coupled to each other through an electric field. Accordingly, when alternating-current signals flow in the coil element L1a and the coil element L1b, electric-field coupling causes currents to be excited in the coil element L2a and the coil element L2b. Capacitors Ca and Cb in FIG. 11 each symbolically represent a coupling capacitance for the electric-field coupling.

When an alternating current flows in the first inductance element L1, the direction of a current flowing in the second inductance element L2 as a result of the coupling through the magnetic field and the direction of a current flowing in the second inductance element L2 as a result of the coupling through the electric field are the same. Accordingly, the first inductance element L1 and the second inductance element L2 are strongly coupled to each other through both the magnetic field and the electric field. Specifically, it is possible to reduce the amount of loss and to transmit high-frequency energy.

By such an advantageous effect, the elements function as a transformer that performs stronger coupling and has less loss, so that an impedance conversion transformer with little loss and a large mutual inductance value are obtained. In addition, by arranging the coil elements L2a and L2b closer to a ground conductor, the parallel capacitance Cp can be obtained.

Figure 12A:
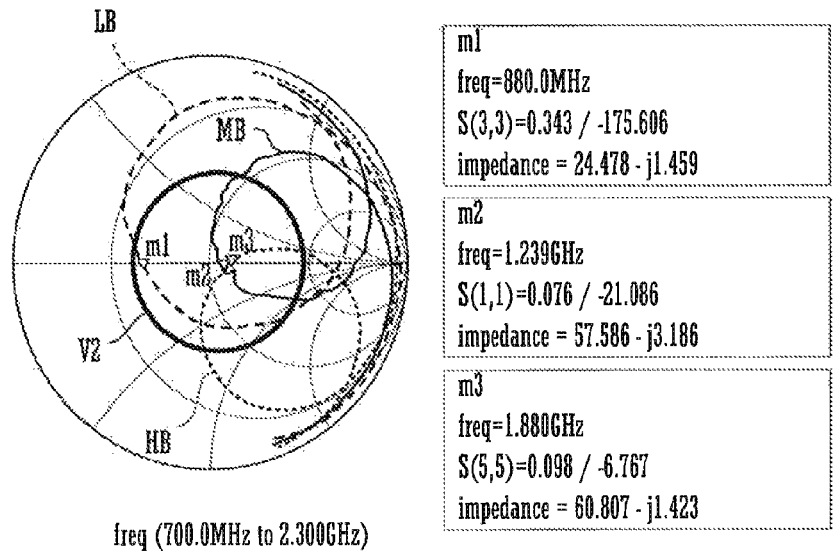
FIG. 12A is a view illustrating, on a Smith chart, reflection cofficient (S11) as viewed from a feeding circuit 30 (from a point P1) of the antenna device 101 as illustrated in FIG. 5 to a radiating element 11 side.
Figure 12B:
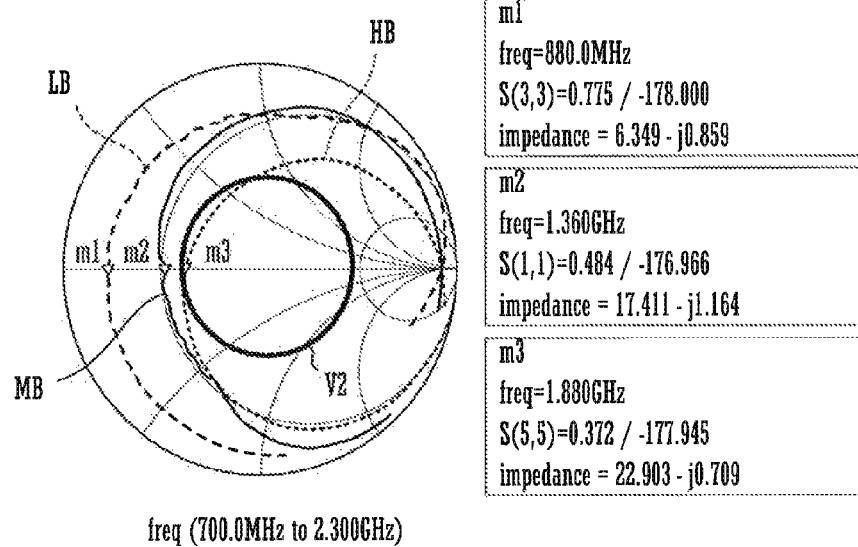
FIG. 12B is a view illustrating, on the Smith chart, reflection cofficient (S11) as viewed from a feeding circuit 30 (from a point P2) to a radiating element 11 side when the transformer matching circuit 15 of the antenna device 101 illustrated in FIG. 5 is not provided.

FIG. 12A is a view illustrating, on a Smith chart, reflection cofficient (S11) as viewed from a feeding circuit 30 (from a point P1) of the antenna device 101 as illustrated in FIG. 5 to a radiating element 11 side. FIG. 12B is a view illustrating, on a Smith chart, reflection cofficient (S11) as viewed from a feeding circuit 30 (from a point P2) to a radiating element 11 side when the transformer matching circuit 15 of the antenna device 101 illustrated in FIG. 5 is not provided. Both FIG. 12A and FIG. 12B illustrate the reactance values of the series active circuit 16 are set to match the imaginary parts of impedance in a predetermined frequency band.

By switching the reactance values of the series active circuit 16 depending on a frequency band, as illustrated in FIG. 12B, while the imaginary part of impedance is zero at 880 MHz, 1.36 GHz, and 1.88 GHz, for example, due to change in frequency, the impedance trace depicts a large circle and outwardly protrudes from a circle V2 of a voltage standing wave ratio VSWR<2, which indicates that the sufficient depth of return loss is not obtained.

In contrast, as illustrated in FIG. 12A, impedance conversion operations of the transformer matching circuit 15 match the real parts of impedance and reduce the impedance trace. In this preferred embodiment, the reactance of the series active circuit 16 sets the imaginary part of impedance to zero at 880 MHz, 1.239 GHz, and 1.88 GHz, and the neighboring frequency is within the range of the circle V2 of VSWR<2, for example. Therefore, the view indicates that the sufficient depth of return loss is obtained.

Figure 13:
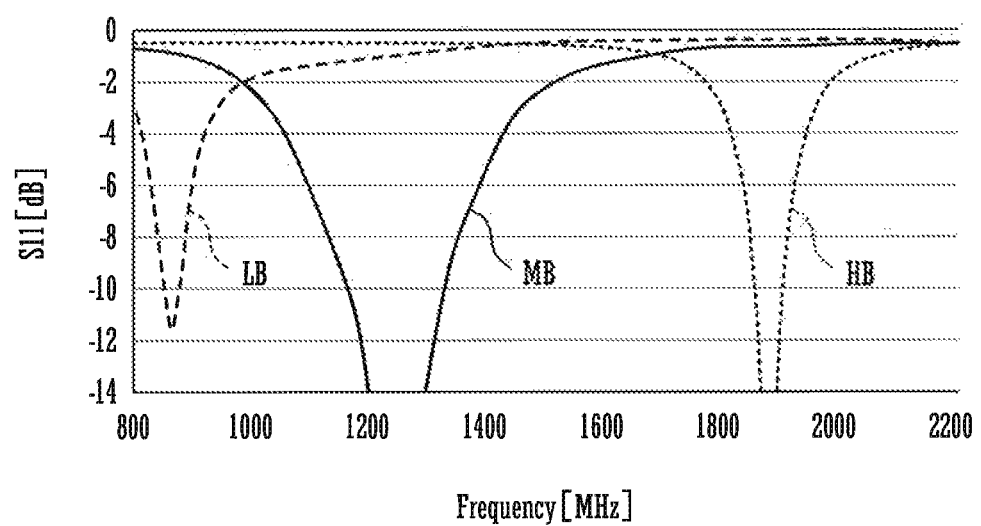
FIG. 13 is a view illustrating a characteristic of return loss (S11) of the antenna device 101 of the first preferred embodiment of the present invention.

FIG. 13 is a view illustrating a characteristic of reflection cofficient (S11) of the antenna device 101 of the first preferred embodiment. In FIG. 13, LB represents a characteristic when the series active circuit 16 is switched to reactance for a low band (900 MHz band), MB represents a characteristic when the series active circuit 16 is switched to reactance for a middle band (1.3 GHz band), and HB represents a characteristic when the series active circuit 16 is switched to reactance for a high band (1.9 GHz band). In this preferred embodiment, the series active circuit 16 includes a reactance value switched to, for example: 11 nH in a low band; 0Ω in a middle band; and 0.55 pF in a high band, respectively. This indicates that the sufficient depth of matching is obtained in each frequency band.

Second Preferred Embodiment

Figure 14:
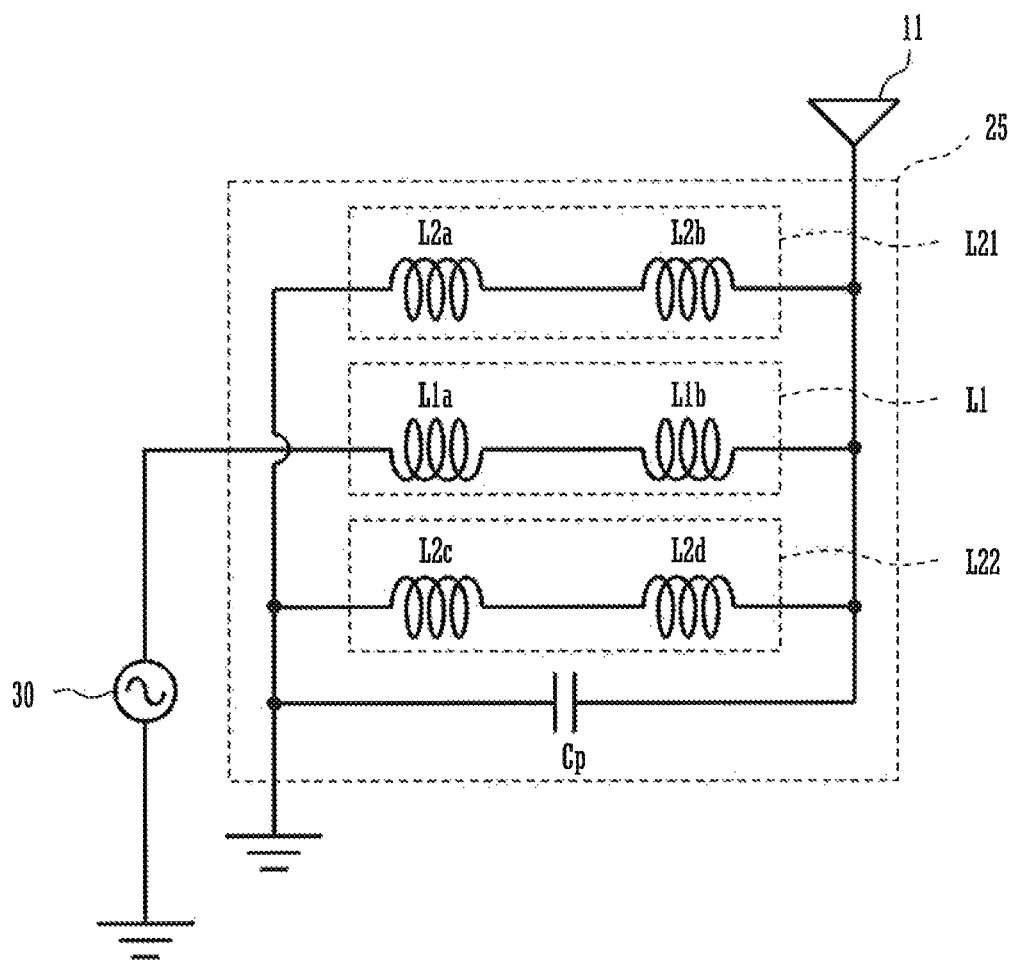
FIG. 14 is a circuit diagram of an antenna device 102 of a second preferred embodiment of the present invention.

FIG. 14 is a circuit diagram of an antenna device 102 of a second preferred embodiment of the present invention. A transformer matching circuit 25 according to the second preferred embodiment includes a first inductance element L1 and two second inductance elements L21 and L22. The first inductance element L1 includes a first coil element L1a and a second coil element L1b. The second inductance element L21 includes a third coil element L2a and a fourth coil element L2b. Another second inductance element L22 includes a third coil element L2c and a fourth coil element L2d.

According to this second preferred embodiment, parallel capacitance Cp is connected to second inductance elements L21 and L22.

Figure 15:
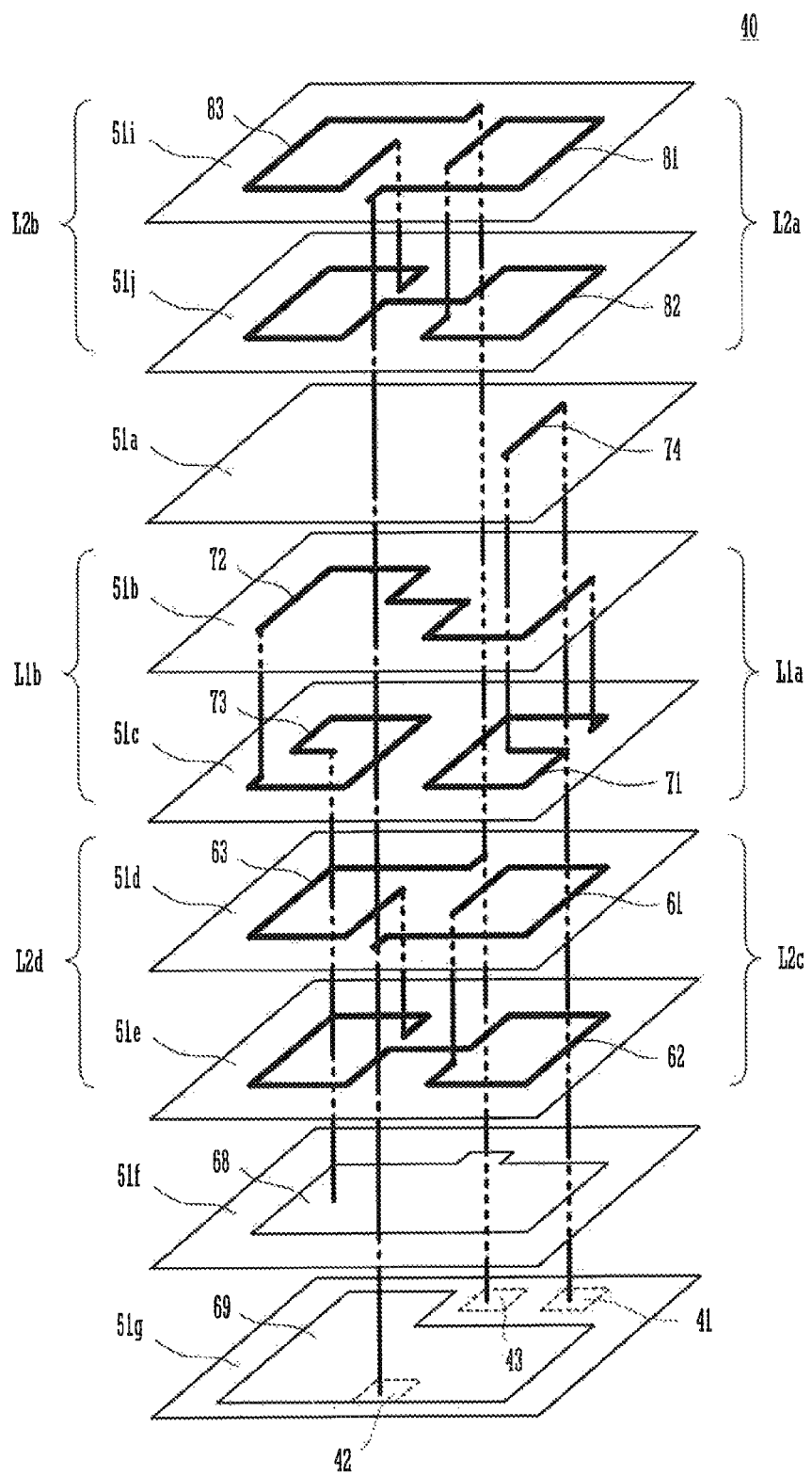
FIG. 15 is an exploded perspective view of a laminate 40 that defines a transformer matching circuit 25.

FIG. 15 is an exploded perspective view of a laminate 40 that defines the transformer matching circuit 25. Each of the individual layers is defined either by a dielectric sheet or a magnetic sheet and a conductor pattern is provided on each layer.

In the area illustrated in FIG. 15, conductor patterns 81 and 83 are provided on the base material layer 51i, a conductor pattern 82 is provided on the base material layer 51j, and a conductor pattern 74 is provided on the base material layer 51a. A conductor pattern 72 is provided on the base material layer 51b, and conductor patterns 71 and 73 are provided on the base material layer 51c. Conductor patterns 61 and 63 are provided on the base material layer 51d, a conductor pattern 62 is provided on the base material layer 51e, and a ground conductor 68 is provided on the base material layer 51f. The base material layer 51g includes a ground conductor 69 on the upper surface; and a feeding terminal 41, a ground terminal 42, and an antenna terminal 43 on the lower surface. Dashed lines extending vertically in FIG. 15 represent via electrodes that provide inter-layer connections between the corresponding conductor patterns.

In FIG. 15, the right half of the conductor pattern 72, and the conductor pattern 71 define the first coil element L1a. The left half of the conductor pattern 72, and the conductor pattern 73 define the second coil element L1b. The conductor pattern 81 and the right half of the conductor pattern 82 define the third coil element L2a. The left half of the conductor pattern 82, and the conductor pattern 83 define the fourth coil element L2b. The conductor pattern 61 and the right half of the conductor pattern 62 define another third coil element L2c. The left half of the conductor pattern 62, and the conductor pattern 63 define another fourth coil element L2d.

The ground conductors 68 and 69 facing each other define parallel capacity Cp illustrated in FIG. 14.

Figure 16:
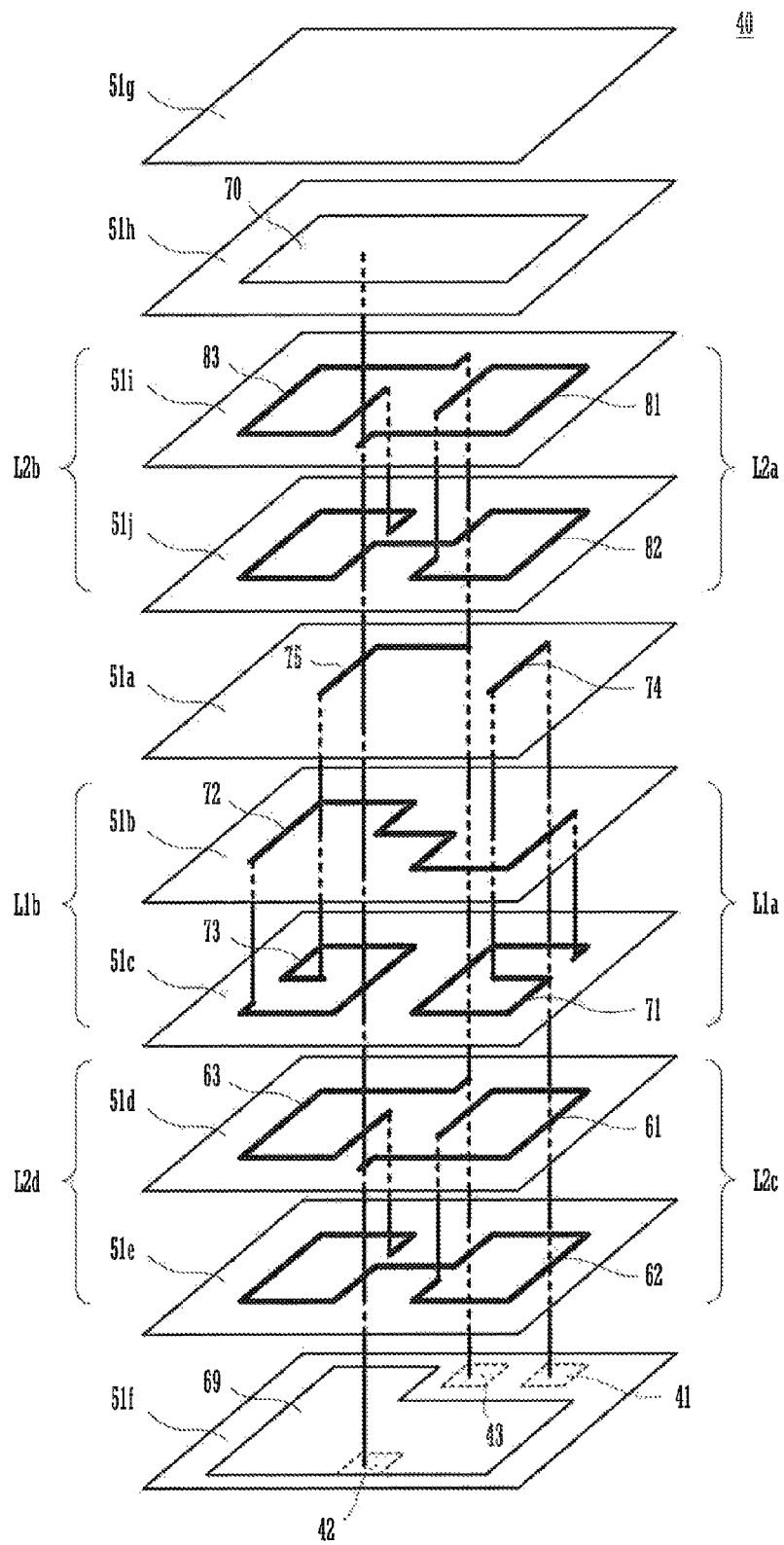
FIG. 16 is an exploded perspective view of another configuration example of the laminate 40 that defines a transformer matching circuit 25.

FIG. 16 is an exploded perspective view of another configuration example of a laminate 40 that defines the transformer matching circuit 25. Each of the individual layers is defined either by a dielectric sheet or a magnetic sheet and a conductor pattern is provided on each layer.

Figure 17:
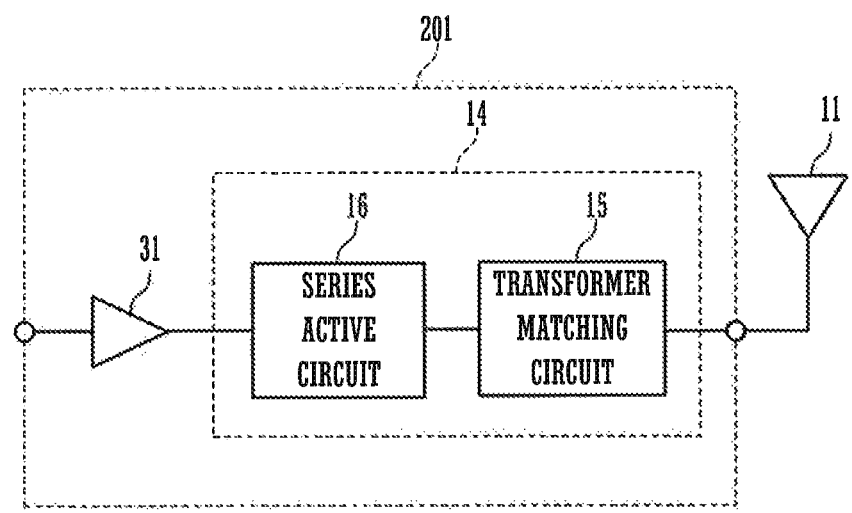
FIG. 17 is a circuit diagram of a high-frequency power amplifying device of a third preferred embodiment of the present invention.

In the area illustrated in FIG. 16, conductor patterns 81 and 83 are provided on the base material layer 51i, a conductor pattern 82 is provided on the base material layer 51j, and conductor patterns 74 and 75 are provided on the base material layer 51a. A conductor pattern 72 is provided on the base material layer 51b, and conductor patterns 71 and 73 are provided on the base material layer 51c. Conductor patterns 61 and 63 are provided on the base material layer 51d, a conductor pattern 62 is provided on the base material layer 51e, and a ground conductor 70 is provided on the base material layer 51h. The base material layer 51f includes a ground conductor 69 on the upper surface; and a feeding terminal 41, a ground terminal 42, and an antenna terminal 43 on the lower surface. Dashed lines extending vertically in FIG. 17 represent via electrodes that provide inter-layer connections between the corresponding conductor patterns.

In FIG. 16, the right half of the conductor pattern 72, and the conductor pattern 71 define the first coil element L1a. The left half of the conductor pattern 72, and the conductor pattern 73 define the second coil element L1b. The conductor pattern 81 and the right half of the conductor pattern 82 define the third coil element L2a. The left half of the conductor pattern 82, and the conductor pattern 83 define the fourth coil element L2b. The conductor pattern 61 and the right half of the conductor pattern 62 define another third coil element L2c. The left half of the conductor pattern 62, and the conductor pattern 63 define another fourth coil element L2d.

The ground conductor 69 and the conductor pattern 62 face each other and generate capacitance between the conductor and the pattern. In addition, the ground conductor 70 and the conductor patterns 81 and 83 face each other and generate capacitance between the conductor and the patterns.

In the example illustrated in this FIG. 16, capacitance generated between the ground conductor 69 and the conductor pattern 62, and capacitance generated between the ground conductor 70 and the conductor patterns 81 and 83 correspond to parallel capacitance Cp illustrated in FIG. 14.

It should be noted, according to the second preferred embodiment, the structure in which the various conductor patterns provided on the plurality of layers are vertically sandwiched by the ground conductors 69 and 70 significantly reduces or prevents unnecessary coupling with an external conductor or a circuit even when the entire laminate is made thin, which makes it possible to obtain stable characteristic and also to achieve reduction in thickness of an antenna device. In addition, by providing the ground conductor 70 on an upper layer of the laminate, the impedance conversion characteristic is not affected even when surface mounted devices are mounted on the upper surface of the laminate. This makes it possible to mount various chip components on the laminate and define a module component.

In FIG. 15 and FIG. 16, the coil element L1a and the coil element L1b define a closed magnetic circuit, the coil element L2a and the coil element L2b define a closed magnetic circuit, and the coil element L2c and the coil element L2d define a closed magnetic circuit. The winding direction and connection relationship of each coil element are determined so that the magnetic fluxes passing through the vertically adjacent closed magnetic circuits repel each other. Therefore, the closed magnetic circuit including the coil element L1a and the coil element L1b in the middle layer is sandwiched between the upper and lower closed magnetic circuits, which enhances the confinement property of a magnetic field. Consequently, a degree of transformer coupling between the primary side and the secondary side is further increased, and loss caused by impedance conversion is even more reduced.

Third Preferred Embodiment

FIG. 17 is a circuit diagram of a high-frequency power amplifying device of a third preferred embodiment of the present invention. This high-frequency power amplifying device 201 includes a high-frequency power amplifier 31 and an impedance-matching switching circuit 14. The impedance-matching switching circuit 14 includes a series active circuit 16 and a transformer matching circuit 15. The transformer matching circuit 15 is connected to a radiating element 11.

The configuration of the transformer matching circuit 15 is similar to the configuration of the transformer matching circuit 15 described in the first preferred embodiment or the second preferred embodiment. Similarly, the configuration of the series active circuit 16 is similar to the configuration of the series active circuit 16 described in the first preferred embodiment or the second preferred embodiment.

The high-frequency power amplifier 31 can basically obtain higher output as a VSWR is smaller, and has a characteristic that the output becomes maximum especially when the phase of impedance of a circuit connected to the output of the high-frequency power amplifier 31 has a predetermined value, so that it is necessary for impedance matching between the high-frequency power amplifier 31 and the radiating element 11 to reduce the VSWR and adjust the phase.

Conventionally, impedance matching has been performed only in a series active circuit or a parallel active circuit, which made it impossible to reduce the VSWR over a wide band and to adjust the phase. According to the configuration illustrated in FIG. 17, phase adjustment can be performed in the series active circuit 16 and matching of the real parts of impedance can be performed in the transformer matching circuit 15. In other words, the reflection cofficient (S11) is reduced to near the center (50Ω) on a Smith chart in the transformer matching circuit 15 and then enters into a circle of a predetermined VSWR, and the phase can be rotated within the circle of the VSWR in the series active circuit 16. Therefore, over a wide band, impedance matching between the high-frequency power amplifier 31 and the radiating element 11 can be performed so that the VSWR is small and the phase becomes a phase in which a high output is obtained.

Fourth Preferred Embodiment

Figure 18A:
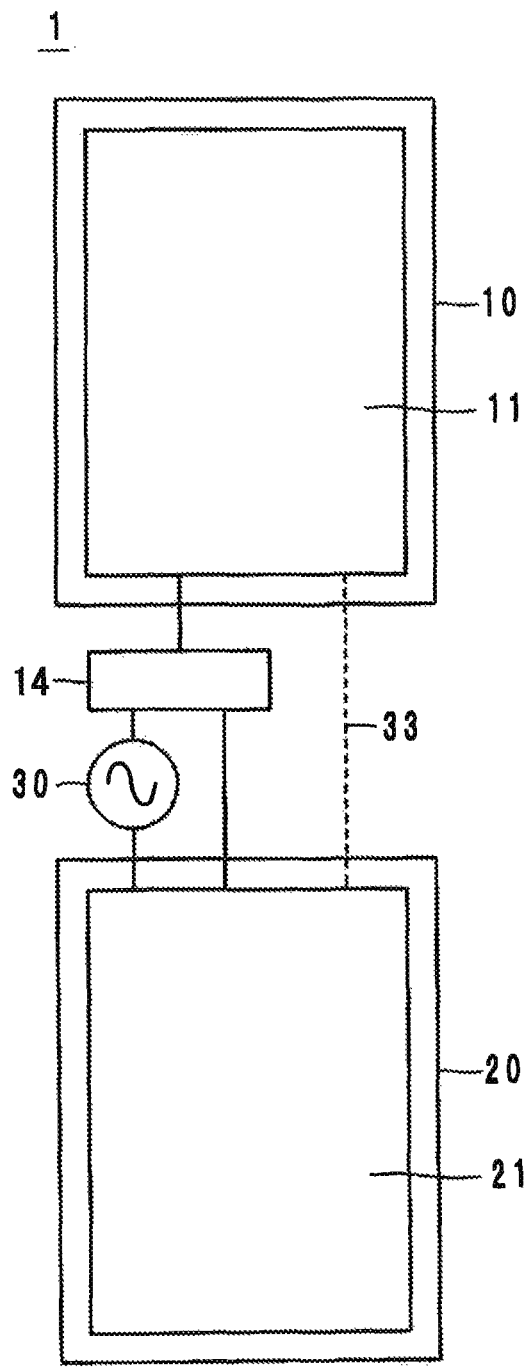
FIG. 18A is a configuration diagram illustrating a communication terminal apparatus as a first example of a fourth preferred embodiment of the present invention.
Figure 18B:
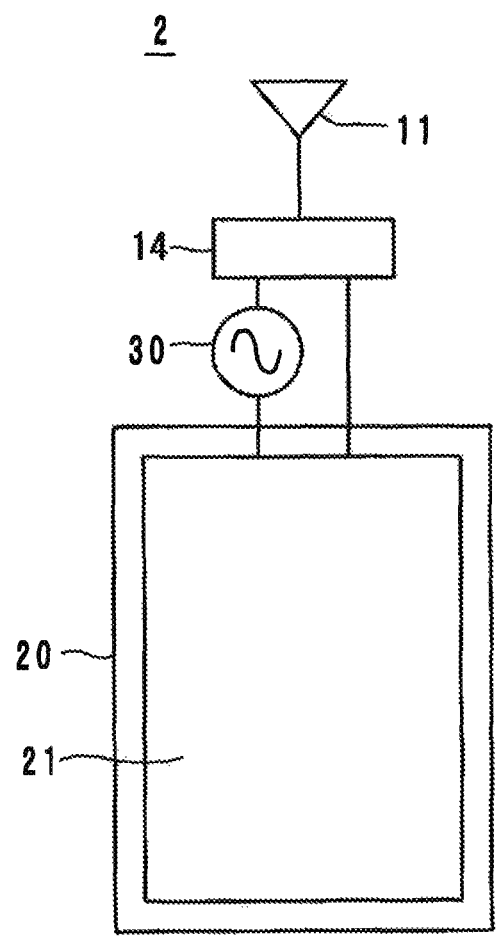
FIG. 18B is a configuration diagram illustrating a communication terminal apparatus as a second example of the fourth preferred embodiment.

A fourth preferred embodiment provides an example of a communication terminal apparatus. FIG. 18A is a configuration diagram illustrating a communication terminal apparatus as a first example of the fourth preferred embodiment of the present invention, and FIG. 18B is a configuration diagram illustrating a communication terminal apparatus as a second example of the fourth preferred embodiment. These communication terminal apparatuses are, for example, terminals configured to receive high-frequency signals (470 MHz to 770 MHz) in a one-segment partial reception service (commonly referred to as "one seg") for portable phones and mobile terminals.

A communication terminal apparatus 1 as illustrated in FIG. 18A includes a first casing 10 serving as a cover portion and a second casing 20 serving as a main portion. The first casing 10 is coupled to the second casing 20 in a flipping or sliding manner. The first casing 10 includes a first radiating element 11 that also functions as a ground plate, and the second casing 20 includes a second radiating element 21 that also functions as a ground plate. The first radiating element 11 and the second radiating element 21 are preferably made of a conductive film that is a thin film such as a metal foil or a thick film made of conductive paste. The first radiating element 11 and the second radiating element 21 are subjected to differential feeding from a feeding circuit 30 so as to have performance similar to the performance of a dipole antenna. The feeding circuit 30 includes a signal processing circuit such as an RF circuit or a baseband circuit.

It is to be noted an inductance value of the impedance-matching switching circuit 14 is preferably smaller than an inductance value of a connection line 33 that connects the two radiating elements 11 and 21. For this reason, since the impedance on the side of the impedance-matching switching circuit 14 becomes lower than the impedance on the side of the connection line 33, current mainly flows on the side of the impedance-matching switching circuit 14. Therefore, the influence of the impedance on the side of the connection line 33 is significantly reduced or prevented.

A communication terminal apparatus 2 illustrated in FIG. 18B includes the first radiating element 11 alone as an antenna. The first radiating element 11 may use various radiating elements such as a chip antenna, a sheet-metal antenna, and a coil antenna. Alternatively, as this radiating element, for example, a linear conductor provided along an inner peripheral surface or an outer peripheral surface of the casing 10 may be used. The second radiating element 21 also functions as a ground plate for the second casing 20, and may use various antennas as in the first radiating element 11. Incidentally, the communication terminal apparatus 2 is not a flip type or a slide type but a straight-structure terminal. It is to be noted that the second radiating element 21 does not necessarily have to sufficiently function as a radiating body, and the first radiating element 11 may act like a so-called monopole antenna, for example.

It should also be noted that, in the communication terminal apparatus 1, the feeding circuit 30 is connected at one end to the second radiating element 21, and connected at the other end through the impedance-matching switching circuit 14 to the first radiating element 11. The first radiating element 11 and the second radiating element 21 are also connected by a connection line 33. This connection line 33 functions as a connection line for electronic components (not illustrated) mounted on the first casing 10 and the second casing 20, and acts as an inductance element with respect to a high-frequency signal, which has no direct effect on the antenna performance.

The impedance-matching switching circuit 14 is provided between the feeding circuit 30 and the first radiating element 11, and stabilizes the frequency characteristics of high-frequency signals transmitted from the first radiating element 11 and the second radiating element 21 or high-frequency signals received by the first radiating element 11 and the second radiating element 21. Thus, the frequency characteristics of the high-frequency signals are stabilized without being affected by the shapes of the first radiating element 11 and the second radiating element 21, the shapes of the first casing 10 and the second casing 20, and the state of arrangement of adjacent components. In particular, in the flip-type or slide-type communication terminal apparatuses, the impedances of the first radiating element 11 and the second radiating element 21 are likely to change depending on the opening/closing state of the first casing 10 serving as a cover portion with respect to the second casing 20 serving as a main portion. However, by proving the impedance-matching switching circuit 14, the frequency characteristics of high-frequency signals can be stabilized. Specifically, this impedance-matching switching circuit 14 can have frequency characteristic adjustment functions such as setting of a center frequency, setting of a pass-band width, and setting of impedance matching that are important for antenna design, so that, for the radiating elements, it is only necessary to take mainly the directivity and gain into consideration, which can simplify the antenna design.

Other Preferred Embodiments

In some of the above described preferred embodiments, while the parallel capacitance Cp is preferably configured to be connected in parallel to the second inductance element L2 so that the frequency characteristic of the impedance conversion ratio of a transformer becomes a characteristic having a tendency opposite (ideally, inversely proportional) to the frequency characteristic of impedance of an antenna, not only the structure in which parallel capacitance is loaded but also a transformer in which the frequency characteristic of the impedance conversion ratio has a characteristic opposite to the frequency characteristic of the impedance of an antenna can perform matching of the real parts of impedance over a wide band.

Like the examples illustrated in FIG. 9, FIG. 15 and FIG. 16, when a transformer matching circuit is configured in a multilayer substrate, all the sheets may be defined by dielectric sheets or magnetic sheets, or only a portion in which the confinement property of the magnetic field is enhanced may be defined by the magnetic sheets.

In FIG. 9, FIG. 15, and FIG. 16, while the configuration examples of a multilayer substrate in a transformer matching circuit have been illustrated, the series active circuit may also be defined in the same multilayer substrate. The reactance element of this series active circuit may be defined by a conductor pattern in a multilayer substrate, or may be defined by mounting a chip component on the multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance-matching switching circuit connected between a first high frequency circuit element including a first connection portion and a second high frequency circuit element including a second connection portion, the impedance-matching switching circuit comprising:

a transformer matching circuit including:
  a first circuit including a first inductance element, a first end, and a second end; and
  a second circuit including a second inductance element transformer-coupled to the first inductance element, a first end, and a second end; and
  a series active circuit connected to the transformer matching circuit in series and configured to select a desired reactance value among a plurality of reactance values; wherein
the first end of the first circuit is connected to the first high frequency circuit element, the second end of the first circuit is connected to the series active circuit, the first end of the second circuit is grounded, the second end of the second circuit is connected to the series active circuit, and the first inductance element and the second inductance element define an auto transformer;
the first high frequency circuit element includes no parallel active circuit at the first connection portion; and
the second high frequency circuit element includes no parallel active circuit at the second connection portion.

2. The impedance-matching switching circuit according to claim 1, wherein the second circuit includes a capacitance element connected in parallel to the second inductance element.

3. The impedance-matching switching circuit according to claim 1, wherein:
  the first circuit includes a first coil element and a second coil element that are connected in series;
  the second circuit includes a third coil element and a fourth coil element that are connected in series;
  the third coil element is electromagnetically coupled to the first coil element; and
  the fourth coil element is electromagnetically coupled to the second coil element.

4. The impedance-matching switching circuit according to claim 3, wherein:
  the first coil element and the second coil element are wound so as to be electromagnetically coupled by a first closed loop of a magnetic flux that is generated by the first coil element and the second coil element;
  the third coil element and the fourth coil element are wound so as to be electromagnetically coupled by a second closed loop of a magnetic flux that is generated by the third coil element and the fourth coil element; and
  the first coil element, the second coil element, the third coil element, and the fourth coil element are wound so that a magnetic flux passing through the first closed loop of a magnetic flux and a magnetic flux passing through the second closed loop of a magnetic flux are in directions opposite to each other.

5. The impedance-matching switching circuit according to claim 3, wherein when an alternating current flows in the first circuit, a direction of a current that flows in the second circuit as a result of coupling through a magnetic field is a same direction as a direction of a current that flows in the second circuit as a result of coupling through an electric field.

6. The impedance-matching switching circuit according to claim 3, wherein the first coil element, the second coil element, the third coil element, and the fourth coil element include a conductor pattern in a common multilayer substrate.

7. The impedance-matching switching circuit according to claim 1, wherein the series active circuit includes a variable capacitance element.

8. An antenna device connected to a feeding circuit including a connection portion, comprising:
  a radiating element including a connection portion; and
  an impedance-matching switching circuit connected to the radiating element, the impedance-matching switching circuit including:
    a transformer matching circuit including:
      a first circuit including a first inductance element, a first end, and a second end; and
      a second circuit including a second inductance element transformer-coupled to the first inductance element, a first end, and a second end; and
    a series active circuit connected in series between the transformer matching circuit and the radiating element, the series active circuit including:
      a plurality of reactance elements; and
      a switch that switches selection of the reactance elements; wherein
  the first end of the first circuit is connected to the feeding circuit, the second end of the first circuit is connected to the series active circuit, the first end of the second circuit is grounded, the second end of the second circuit is connected to the series active circuit, and the first inductance element and the second inductance element define an auto transformer;
  the feeding circuit includes no parallel active circuit at the connection portion of the feeding circuit; and
  the radiating element includes no parallel active circuit at the connection portion of the radiating element.

9. The antenna device according to claim 8, wherein the radiating element has an electrical length that is shorter than a wavelength of a high frequency radio signal transmitted and received by the radiating element.

10. The antenna device according to claim 8, wherein the feeding circuit is a circuit in which a high frequency radio signal in a plurality of frequency bands is transmitted or received or a circuit in which a high frequency radio signal in a plurality of frequency bands is transmitted and received.

11. The antenna device according to claim 8, wherein the second circuit includes a capacitance element connected in parallel to the second inductance element.

12. The antenna device according to claim 8, wherein:
  the first circuit includes a first coil element and a second coil element that are connected in series;
  the second circuit includes a third coil element and a fourth coil element that are connected in series;
  the third coil element is electromagnetically coupled to the first coil element; and
  the fourth coil element is electromagnetically coupled to the second coil element.

13. The antenna device according to claim 12, wherein:
the first coil element and the second coil element are wound so as to be electromagnetically coupled by a first closed loop of a magnetic flux that is generated by the first coil element and the second coil element;
the third coil element and the fourth coil element are wound so as to be electromagnetically coupled by a second closed loop of a magnetic flux that is generated by the third coil element and the fourth coil element; and
the first coil element, the second coil element, the third coil element, and the fourth coil element are wound so that a magnetic flux passing through the first closed loop of a magnetic flux and a magnetic flux passing through the second closed loop of a magnetic flux are in directions opposite to each other.

14. The antenna device according to claim 12, wherein when an alternating current flows in the first circuit, a direction of a current that flows in the second circuit as a result of coupling through a magnetic field is a same direction as a direction of a current that flows in the second circuit as a result of coupling through an electric field.

15. The antenna device according to claim 12, wherein the first coil element, the second coil element, the third coil element, and the fourth coil element include a conductor pattern in a common multilayer substrate.

16. The antenna device according to claim 8, wherein the series active circuit includes a variable capacitance element.

17. A high-frequency power amplifying device comprising:
- a high-frequency power amplifier with an output portion; and
- an impedance-matching switching circuit connected between the output portion of the high-frequency power amplifier and a high frequency circuit element including a connection portion, the impedance-matching switching circuit including:
  - a transformer matching circuit including:
    - a first circuit including a first inductance element, a first end, and a second end; and
    - a second circuit including a second inductance element transformer-coupled to the first inductance element, a first end, and a second end; and
  - a series active circuit connected in series between the transformer matching circuit and the high-frequency power amplifier, the series active circuit including:
    - a plurality of reactance elements; and
    - a switch that switches selection of the reactance elements; wherein
- the first end of the first circuit is connected to the series active circuit, the second end of the first circuit is connected to the high frequency circuit element, the first end of the second circuit is grounded, the second end of the second circuit is connected to the high frequency circuit element, and the first inductance element and the second inductance element define an auto transformer;

the high-frequency power amplifier includes no parallel active circuit at the output portion; and the high frequency circuit element includes no parallel active circuit at the connection portion.

18. A communication terminal apparatus comprising:
- a radiating element including a connection portion;
- a feeding circuit including a connection portion;
- an impedance-matching switching circuit; and
- a casing in which the radiating element, the feeding circuit, and the impedance-matching switching circuit located between the radiating element and the feeding circuit are arranged, the impedance-matching switching circuit including:
  - a transformer matching circuit including:
    - a first circuit including a first inductance element, a first end, and a second end; and
    - a second circuit including a second inductance element transformer-coupled to the first inductance element, a first end, and a second end; and
  - a series active circuit connected in series between the transformer matching circuit and the radiating element, the series active circuit including:
    - a plurality of reactance elements; and
    - a switch that switches selection of the reactance elements; wherein
- the first end of the first circuit is connected to the feeding circuit, the second end of the first circuit is connected to the series active circuit, the first end of the second circuit is grounded, the second end of the second circuit is connected to the series active circuit, and the first inductance element and the second inductance element define an auto transformer;
- the feeding circuit includes no parallel active circuit at the connection portion of the feeding circuit; and
- the radiating element includes no parallel active circuit at the connection portion of the radiating element.

\* \* \* \* \*